US012557425B2

(12) United States Patent
Algasinger et al.

(10) Patent No.: US 12,557,425 B2
(45) Date of Patent: Feb. 17, 2026

(54) METHOD FOR POST-TREATING AN ABSORBER LAYER

(71) Applicant: (CNBM) RESEARCH INSTITUTE FOR ADVANCED GLASS MATERIALS GROUP CO., LTD, Bengbu (CN)

(72) Inventors: Michael Algasinger, Munich (DE); Thomas Dalibor, Herrsching am Ammersee (DE); Joerg Palm, Munich (DE)

(73) Assignee: CNBM RESEARCH INSTITUTE FOR ADVANCED GLASS MATERIALS GROUP CO., LTD., Bengbu (CN)

( * ) Notice: Subject to any disclaimer, the term of this patent is extended or adjusted under 35 U.S.C. 154(b) by 339 days.

(21) Appl. No.: 17/276,458

(22) PCT Filed: Sep. 17, 2019

(86) PCT No.: PCT/CN2019/106104
§ 371 (c)(1),
(2) Date: Mar. 15, 2021

(87) PCT Pub. No.: WO2020/057484
PCT Pub. Date: Mar. 26, 2020

(65) Prior Publication Data
US 2022/0037553 A1  Feb. 3, 2022

(30) Foreign Application Priority Data
Sep. 22, 2018 (EP) .................................... 18196125

(51) Int. Cl.
*H01L 31/18* (2006.01)
*H10F 19/37* (2025.01)
(Continued)

(52) U.S. Cl.
CPC ............. *H10F 71/00* (2025.01); *H10F 19/37* (2025.01); *H10F 77/127* (2025.01); *H10F 77/45* (2025.01)

(58) Field of Classification Search
CPC ............... H01L 31/186; H01L 31/0324; H01L 31/0468; H01L 31/055; H01L 31/0322;
(Continued)

(56) References Cited

U.S. PATENT DOCUMENTS 5,252,140 A   10/1993  Kobayashi et al.
5,626,688 A    5/1997  Probst et al.
(Continued)

FOREIGN PATENT DOCUMENTS

CN    1952222 A      4/2007
CN  101093863 A     12/2007
(Continued)

OTHER PUBLICATIONS

Barreau, N. et al. "Study of the new b-In2S3 containing Na thin films Part I: Synthesis and structural characterization of the material", Journal of Crystal Growth 241, (Jan. 2002).
(Continued)

*Primary Examiner* — Ermias T Woldegeorgis
(74) *Attorney, Agent, or Firm* — Bayramoglu Law Offices LLC

(57) ABSTRACT

A method for post-treating an absorber layer for photoelectric conversion of incident light into electric current. The method includes providing a chalcogen-containing absorber layer on a carrier, applying a post-treatment layer on a surface of the absorber layer, wherein the post-treatment material is not a buffer or component of a buffer, and thermally diffusing the post-treatment material into the absorber layer. A method for producing a layer system for the production of thin-film solar cells is also described.

20 Claims, 8 Drawing Sheets

(51) Int. Cl.
    *H10F 71/00*       (2025.01)
    *H10F 77/12*       (2025.01)
    *H10F 77/45*       (2025.01)

(58) Field of Classification Search
    CPC ........ Y02E 10/52; Y02E 10/541; Y02P 70/50;
                 H10F 71/00; H10F 19/37; H10F 77/127;
                 H10F 77/45; H10F 77/126
    See application file for complete search history.

(56) References Cited

U.S. PATENT DOCUMENTS

| | | | |
|---|---|---|---|
| 7,235,736 | B1 * | 6/2007 | Buller .................. H01L 31/055 |
| | | | 136/246 |
| 2002/0043279 | A1 | 4/2002 | Karg |
| 2004/0144419 | A1 | 7/2004 | Fix et al. |
| 2008/0169025 | A1 | 7/2008 | Basol et al. |
| 2008/0216895 | A1 * | 9/2008 | Aoki .................. H01L 31/0463 |
| | | | 136/265 |
| 2010/0229951 | A1 | 9/2010 | Aida et al. |
| 2010/0248417 | A1 | 9/2010 | Yonezawa et al. |
| 2011/0011451 | A1 | 1/2011 | Hakuma et al. |
| 2011/0168258 | A1 | 7/2011 | Palm et al. |
| 2011/0214725 | A1 | 9/2011 | Beck et al. |
| 2012/0067407 | A1 | 3/2012 | Fujdala et al. |
| 2012/0073659 | A1 * | 3/2012 | Fujdala ............. H01L 21/02581 |
| | | | 136/265 |
| 2013/0045558 | A1 | 2/2013 | Palm et al. |
| 2014/0080250 | A1 * | 3/2014 | Liang .................... H10F 71/00 |
| | | | 438/95 |
| 2014/0332070 | A1 | 11/2014 | Sugimoto et al. |
| 2016/0163905 | A1 | 6/2016 | Palm et al. |
| 2017/0033245 | A1 | 2/2017 | Palm et al. |

FOREIGN PATENT DOCUMENTS

| | | | |
|---|---|---|---|
| CN | 102130202 | A | 7/2011 |
| CN | 102169910 | A | 8/2011 |
| CN | 102214735 | A | 10/2011 |
| CN | 102337516 | A | 2/2012 |
| CN | 103296130 | A | 9/2013 |
| CN | 105742412 | A * | 7/2016 |
| DE | 4442824 | C1 | 1/1996 |
| DE | 102006004909 | A1 | 9/2007 |
| DE | 19956735 | B4 | 8/2008 |
| EP | 1356528 | A1 | 10/2003 |
| EP | 0715358 | B1 | 6/2010 |
| FR | 2826951 | A1 | 1/2003 |
| JP | 2004342678 | A * | 12/2004 |
| KR | 101062180 | B1 * | 9/2011 | ......... H01L 31/0445 |
| WO | 02/065554 | A1 | 8/2002 |
| WO | 2009/141132 | A2 | 11/2009 |
| WO | WO-2011074685 | A1 * | 6/2011 | ......... H01L 31/0322 |
| WO | 2011/104235 | A1 | 9/2011 |
| WO | 2013/077431 | A1 | 5/2013 |
| WO | 2014/207226 | A1 | 12/2014 |
| WO | 2014/207233 | A1 | 12/2014 |
| WO | 2016/210187 | A1 | 12/2016 |

OTHER PUBLICATIONS

Barreau, N. et al., "A study of bulk NaxCu1-xIn5S8 and its impact on the Cu(In, Ga)Se2/In2S3 interface of solar cells", Solar Energy Materials and Solar Cells, vol. 90, Issue 12, pp. 1840-1848, (Jul. 2006).
Barreau, N. et al., "Indium Sulfide and Relatives in the World of Photovoltaics", Solar Energy 83, pp. 636-371, (Jan. 2009).
Barreau, N. et al., "New Cd-Free Buffer Layer Deposited by PVD: In2s3 Containing Na Compounds", Thin Solid Films, 431, pp. 326-329, (May 2003).
Barreau, N. et al., "Study of the new β-In2S3 containing Na thin films. Part II: Optical and electrical characterization of thin films", Journal of Crystal Growth, 241, pp. 51-56, (Jan. 2002).
Final Office Action for U.S. Appl. No. 14/900,939, filed Dec. 22, 2015 on behalf of Saint-Gobain Glass France. Mail Date: Oct. 22, 2019. 15 Pgs.
H.J. Deiseroth "KIn5S6 and MIn5S7 (M: Na, K): Three New Mixed Valent Thioindates of Alkali Metals and their Crystal Chemical Relations" Z. anorg. allg. Chem. 624 (Jan. 1998).
H.J. Deiseroth "MIn 3S5 (M=Rb, Cs), a New Structure Type based on a Joint ccp Arrangement of S2− and M+: Structure, Microstructure, and Twinning" Z. Anorg. Alig. Chem. (Jan. 2002), 628, 1641-1647.
International Search Report for International Application No. PCT/CN2014/094607 filed on Dec. 23, 2014 on behalf of Bengbu Institute Mail Date: Mar. 24, 2015 4 pgs.
International Search Report for International Application No. PCT/EP2014/063747 filed Jun. 27, 2014 on behalf of Saint-Gobain Glass France. Mail Date: Sep. 8, 2014. 5 pgs. (German Original + English Translation).
International Search Report for International PCT Application No. PCT/CN2019/106104 filed on Sep. 17, 2019, on behalf of Bengbu Design & Research Institute for Glass Industry Co., Ltd. (CNBM). Mail Date: Dec. 11, 2019. 4 pgs.
Meril Mathew, "Anomalous behavior of silver doped indium sulfide thin films" Journal of Applied Physics 100, 033504 (Jan. 2006); doi: 10.1063/1.2221531 (Abstract Only).
Non-Final Office Action for U.S. Appl. No. 15/107,085, filed Jun. 21, 2016 on behalf of Bengbu Design & Research Institute Mail Date: Nov. 30, 2018 10 pgs.
Non-Final Office Action for U.S. Appl. No. 14/900,939, filed Dec. 22, 2015 on behalf of Saint-Gobain Glass France Mail Date: Apr. 26, 2019 12 pgs.
Non-Final Office Action for U.S. Appl. No. 14/900,939, filed Dec. 22, 2015 on behalf of Saint-Gobain Glass France. Mail Date: Aug. 6, 2018. 16 pgs.
Non-Final Office Action for U.S. Appl. No. 14/900,939, filed Dec. 22, 2015 on behalf of Saint-Gobain Glass France. Mail Date: Nov. 16, 2017. 16 pgs.
Restriction Requirement for U.S. Appl. No. 15/107,085, filed Jun. 21, 2016 on behalf of Bengbu Design & Research Institute Mail Date: Aug. 3, 2018 8 pgs.
Restriction Requirement for U.S. Appl. No. 14/900,939, filed Dec. 22, 2015 on behalf of Saint-Gobain Glass France. Mail Date: Aug. 16, 2017. 8 pgs.
Written Opinion for International Application No. PCT/CN2014/094607 filed on Dec. 23, 2014 on behalf of Bengbu Institute Mail Date: Mar. 24, 2015 5 pgs.
Written Opinion for International Application No. PCT/EP2014/063747 filed Jun. 27, 2014 on behalf of Saint-Gobain Glass France. Mail Date: Sep. 8, 2014. 8 pgs. (German Original + English Translation).
Written Opinion for International PCT Application No. PCT/CN2019/106104 filed on Sep. 17, 2019, on behalf of Bengbu Design & Research Institute for Glass Industry Co., Ltd. (CNBM). Mail Date: Dec. 11, 2019. 5 Pgs.

* cited by examiner

METHOD FOR POST-TREATING AN ABSORBER LAYER

CROSS-REFERENCE TO RELATED APPLICATIONS

The present application is the U.S. National Stage of International Patent Application No. PCT/CN2019/106104 filed on Sep. 17, 2019 which, in turn, claims priority to European Patent Application No. EP 18196125.1 filed on Sep. 22, 2018.

The present invention is in the technical field of the production of thin-film solar cells and relates to a method for post-treating an absorber layer whose semiconductor material is used for the conversion of incident sunlight into electric current. The invention further extends to the production of a layer system for thin-film solar cells, wherein such post-treatment is done, as well as, generally, to the use of the method for post-treating an absorber layer in the production of a layer system for thin-film solar cells.

Photovoltaic layer systems for the production of thin-film solar cells are well known to the person skilled in the art, for example, through solar modules available on the market. The materials of the layers, in particular the semiconducting material of the absorber layer used for the photoelectric conversion, are selected such that the incident sunlight can be converted into electric current with satisfactory efficiency. Due to the physical properties and the technological handling qualities, absorber layers made of amorphous, micromorphous, or polycrystalline silicon, cadmium telluride (CdTe), gallium arsenide (GaAs), copper indium/gallium diselenide/disulfide/disulfoselenide (Cu(In,Ga) (S,Se)$_2$), copper zinc tin sulfoselenide (CZTS from the kesterite group) as well as organic semiconductors are particularly well suited for thin-film solar cells. The pentenary semiconductor Cu(In,Ga) (S,Se)$_2$, which belongs to the group of chalcopyrite compound semiconductors, has gained special significance in the industrial series production of thin-film solar modules.

Thin-film solar cells with an absorber based on Cu(In,Ga) (S,Se)$_2$ usually require a buffer layer between the p-conductive absorber and an n-conductive front electrode. Until now, cadmium sulfide (CdS) has most frequently been used as a buffer layer that enables relatively high efficiency of the thin-film solar cells. Efficiency describes the ratio of incident power to the electric power output of a thin-film solar cell. With CdS buffer layers, with lab cells on small areas, efficiency of as much as roughly 23% can be achieved, while the efficiency for large-area solar modules is lower and is typically between 12% and 18%.

Cadmium sulfide is deposited in a wet chemical bath process (CBD process, CBD=chemical bath deposition), which has, however, the disadvantage that the deposition process is difficult to integrate into the process flow of current production of Cu(In,Ga) (S,Se)$_2$ thin-film solar cells. In particular, for this, the vacuum must be broken, entailing the risk of undesirable contamination of the absorber layer. Another disadvantage of the CdS buffer layer consists in that it contains the toxic heavy metal cadmium. This creates higher production costs since increased safety precautions must be taken in the production process, for example, in the disposal of the wastewater. In addition, the disposal of the product can cause higher costs for the customer since, depending on the local laws, the manufacturer could be forced to take back, to dispose of, or to recycle the product. A further disadvantage of CdS buffer layers consists in that cadmium sulfide is a semiconductor with a direct electronic band gap of approx. 2.4 eV, resulting in the fact that the incident light is not insignificantly absorbed. However, the light absorbed in the buffer layer is lost for the electrical yield since the charge carriers generated in the buffer layer recombine right away and there are many crystal defects in this region of the heterojunction and in the buffer material that act as recombination centers. The result is a reduction in the efficiency of the thin-film solar cell.

Consequently, various alternatives to the buffer made of cadmium sulfide have been tested for absorbers from the family of the Cu(In,Ga) (S,Se)$_2$ semiconductors, for example, sputtered ZnMgO, Zn(S,OH) deposited by CBD, In(O,OH) deposited by CBD, and indium sulfide deposited by atomic layer deposition (ALD), ion layer gas deposition (ILGAR), spray pyrolysis, or physical vapor deposition (PVD) processes, such as thermal evaporation or sputtering. However, usually the same efficiencies cannot be achieved by these buffer materials for thin-film solar cells with absorbers based on Cu(In,Ga) (S,Se)$_2$ as for a CdS buffer layer and further disadvantages can occur.

Especially in the case of buffers based on In$_x$S$_y$, a higher band gap can be produced by adding alkali metals and/or halides than in the case of buffers based on CdS in order to avoid the disadvantages of the CdS buffer associated with a smaller band gap. However, to achieve the highest possible efficiency, the elements In, S, and the alkali metal and/or halide must be controlled in a relatively narrow adjustment range, both in terms of homogeneity over the entire module surface and in terms of the complete duration of an evaporation cycle in production. Decisive here are the In/(In+S) ratio and the Na/In ratio. In addition, the partially corrosive evaporation materials or products increase the downtime of production systems due to the necessary replacement of components. Moreover, the optimum Na/In ratio is also a function of the total alkali content of the CIGSSe absorber. Buffer layers based on indium sulfide are known, for example, from WO 2009/141132 A2, WO 107210187, WO 2014/207233, and WO 2014/207226.

Furthermore, buffer layers different from CdS typically exhibit excessive instabilities, hysteresis effects, or degradations in efficiency when they are exposed to light, heat, and/or moisture.

Generally, the highest possible efficiency for the conversion of light into electric power should be achieved with the solar module, which presupposes that the buffer layer used has optical absorption that is as low as possible. The efficiency must be as stable as possible when the component is exposed to temperature, light, moisture, and mechanical and electrical stress. In fact, hysteresis effects are often observed with chalcopyrite-based solar cells, wherein the efficiency can degrade due to the influence of heat and/or moisture. The efficiency can be partially restored by illumination; however, irreversible losses can persist. In some cases, after production of the cells, the efficiency is established only after lengthy illumination (light soaking).

With regard to commercial exploitation of solar modules, the costs for the production of the buffer layer, in other words, costs for equipment, material, and operation (media, electricity, disposal, waste water) should be as low as possible. In addition, the manufacturing process for the buffer must be compatible with the other processes and, in particular, the underlying layer system must not be damaged by the process used.

The invention targets the above objects. Thus, on the one hand, the efficiency of thin-film solar cells should be improved in order to enable the economically viable use of alternatives to the buffer layer made of CdS in the industrial series production of thin-film solar modules. On the other, the production of thin-film modules should be, in particular through the selection of the buffer materials and production methods for the buffer, technically simple to implement, economical, and environmentally compatible. These and other objects are accomplished according to the proposal of the invention by a method for post-treating an absorber layer with the features of the independent claim. Advantageous embodiments of the invention are indicated through the features of the subclaims.

According to the invention, a method for post-treating an absorber layer is presented whose semiconductor material is used for (photo)electric conversion of incident sunlight into electric current. The method according to the invention is advantageously used for post-treating an absorber layer in a method for producing a layer system (layer structure) for the production of thin-film solar cells.

The following statements describe features of thin-film solar cells or thin-film solar modules for which the method according to the invention for post-treating absorber layers can be advantageously used, with the method according to the invention for post-treating absorber layers also intended for this.

Thin-film solar cells are generally based on photovoltaic layer systems with a low overall thickness of, for example, a few microns, that require a carrier for adequate mechanical stability. The carrier is made, for example, of glass, plastic, ceramic, metal, or a metal alloy and can be designed, depending on the respective carrier thickness and the specific material properties, as a rigid plate or a flexible film. Glass, in particular soda lime glass, is preferred as the carrier material. The layer thickness of the carrier is, for example, in the range from 1 mm to 5 mm.

Advantageously, this is a thin-film solar module with a composite pane structure that has a transparent cover plate (e.g., glass) and a back substrate (e.g., glass) that are fixedly bonded to one another by a thermoplastic or cross-linking polymer intermediate layer (e.g., PVB or EVA). The thin-film solar module can have a so-called "substrate configuration", wherein the layer system for forming the thin-film solar cells is applied on a light-entry-side surface of the back substrate. In this case, the back substrate is used as a carrier for the layer system. The thin-film solar module can equally have a so-called "superstrate configuration" in which the layer system is applied on a surface of the front cover plate facing away from the light-entry side. In this case, the front cover plate is used as a carrier for the layer system.

The layer system for the production of thin-film solar cells comprises a plurality of layers that are arranged lying one atop another. In the context of the present invention, if not explicitly indicated, the arrangement of a layer "atop/on" another layer in the layer system does not mean that the two layers have to lie directly on one another. Rather, one or a plurality of other layers (intermediate layers) can be arranged between these two layers. Similarly, a layer arranged "atop/on" the carrier need not mandatorily be arranged directly on the carrier. The term "layer" can describe a single ply made of one and the same material but also extends, however, to a plurality of single plies arranged one atop another in the form of a stack, wherein two directly adjacent single plies are made of different materials to distinguish them from one another. Also referred to as a "layer" is a single ply (or a plurality of single plies) on which an electrically conductive structure is deposited, for example, an electrically non-conductive single ply on which a metal lattice is deposited to make the layer conductive.

In the present description of the invention, relative material amount (in at. %) of elements of the layer is indicated for the composition of a layer. The relative material amounts of specific elements of the layer relate in each case to the total quantity of all elements of the layer. Accordingly, the relative material amount of a material describes the relative share of the amount of this material in the total of the amounts of all materials in the layer. The sum of the relative material amounts of all elements of the layer is 100 at. %. Impurities that are unavoidable from a production technology standpoint can have a negligible content in a layer. However, it is also possible for such impurities to have a non-negligible share. Preferably, the sum of the relative material amounts of impurities of a layer is a maximum of 1 at. %.

The layer system for producing the thin-film solar module comprises, in a manner known per se, a largely opaque back electrode layer, a transparent front electrode layer, which must enable the passage of incident sunlight, and, arranged between the back and the front electrode layer, a photovoltaically active absorber layer whose semiconductor material is used in the solar cells for the photoelectric conversion of sunlight into electric current.

The optically transparent front electrode layer preferably contains at least one transparent, doped metal oxide (TCO=transparent conductive oxide), particularly preferably aluminum-doped, gallium-doped, or boron-doped zinc oxide, and/or indium tin oxide (ITO). Preferably, the front electrode layer is made at the rate of at least 95 at. %, particularly preferably at least 99 at. %, of the at least one doped metal oxide, with the above percentage values indicating the sum of the relative material amounts of the elements of the transparent, doped metal oxide. The layer thickness of the front electrode layer is, for example, 100 to 1500 nm. It is also conceivable for the front electrode layer to have a single ply of a transparent, electrically non-conductive material onto which a metal lattice is applied, making the front electrode layer electrically conductive.

The typically opaque back electrode contains, for example, at least one metal, preferably molybdenum (Mo), aluminum (Al), copper (Cu), titanium (Ti), or zinc (Zn) or consists of a multilayer system with such a metal. Preferably, the back electrode layer consists at a rate of at least 95 at. %, particularly preferably of at least 99 at. %, of the at least one metal. In an advantageous embodiment of the back electrode, it has a partial layer of at least one metallic material that is adjacent the absorber layer, as well as a silicon nitride partial layer (SiN) that is applied on the carrier. Such back electrode layers are known, for example, from EP 1356528 A1. The layer thickness of the back electrode layer is typically less than 1 μm, is, for example, in the range from 200 nm to 600 nm, and can be, in particular, for example, 400 nm. The back electrode layer is used as a back contact of the solar cells. An alkali barrier, made, for example, of $Si_3N_4$, SiON or SiCN, can be arranged between the carrier and the back electrode.

In the context of the present invention, the term "transparent" refers to a transmittance for visible light and infrared light of at least 85%, in particular at least 90%, preferably at least 95%, in particular 100%. Typically, visible light is in the wavelength range from 380 nm to 780 nm; infrared light extends to 1300 nm. The term "opaque" refers to a transmittance for visible and infrared light of less than 5%, in particular 0%.

The absorber layer that is post-treated by the method according to the invention contains a chalcogen-containing semiconductor material. The elements of the sixth group of the periodic table are referred to as chalcogens. The semiconductor material of the absorber layer contains at least one chalcogen, preferably sulfur and/or selenium.

Preferably, the absorber layer includes a chalcogen-containing chalcopyrite compound semiconductor, which is, particularly preferably, a ternary I-III-VI-compound semiconductor from the group copper indium/gallium disulfide/diselenide, abbreviated by the formula Cu(In,Ga)(S,Se)$_2$. In the preceding formula, indium and gallium can each be present alone or in combination. The same also applies to the chalcogens sulfur and selenium, each of which can be present alone or in combination. The chalcogen-containing chalcopyrite compound semiconductor contains at least one chalcogen, preferably sulfur and/or selenium. Particularly suitable as material for the absorber layer are CISe (copper indium diselenide), CIS (copper indium disulfide), CIGSe (copper indium gallium diselenide) CIGS (copper indium gallium disulfide), or CIGSSe (copper indium gallium disulfoselenide).

The absorber layer equally preferably includes a chalcogen-containing kesterite compound semiconductor, preferably copper zinc tin sulfoselenide (CZTS). The chalcogen-containing kesterite compound semiconductor contains at least one chalcogen, preferably sulfur and/or selenium.

Expediently, a Cu(In,Ga)(S,Se)$_2$ absorber layer is produced in a two-stage RTP process (RTP=rapid thermal processing). Here, after producing a back electrode layer on the carrier, a precursor layer is first applied on the back electrode layer. The precursor layer, which can comprise a plurality of single plies, contains the elements copper, indium and gallium, which are preferably applied by sputtering. The precursor layer further includes at least one chalcogen in elemental form, preferably selenium and/or sulfur, which is preferably applied by thermal evaporation. During these deposition processes, the temperature of the carrier is typically below 100° C. such that the elements remain substantially unreacted as a metal alloy and an elemental chalcogen (selenium and/or sulfur). Then, the precursor layer is reacted by heating in an atmosphere containing at least one chalcogen (selenium and/or sulfur) to form a Cu(In,Ga)(S,Se)$_2$ compound semiconductor (thermally reacted). For example, the precursor layer contains only elemental selenium as a chalcogen and the thermal conversion of the precursor layer is done in an atmosphere that contains only sulfur as a chalcogen. As a result of the heat treatment of the precursor layer, crystal formation and phase transformation of the precursor layer occur to form the actual semiconductor layer (compound semiconductor). Such a two-stage method is known, for example, from J. Palm et al., "CIS module pilot processing applying concurrent rapid selenization and sulfurization of large area thin film precursors", Thin Solid Films 431-432, PP. 414-522 (2003). Similarly, a chalcogen-containing kesterite compound semiconductor can be produced in a two-stage process, wherein, first, a precursor layer is applied on the back electrode layer, which contains copper, zinc, tin, and at least one chalcogen (preferably sulfur and/or selenium, particularly preferably only selenium). Then, the precursor layer is reacted by heating in an atmosphere that contains at least one chalcogen (preferably sulfur and/or selenium, particularly preferably only sulfur), to form the compound semiconductor.

Preferably, the absorber layer consists of the chalcogen-containing semiconductor material at the rate of at least 80 at. %, in particular at least 90 at. %, in particular at least 95 at. %, where the above percentage values indicate the sum of the relative material amounts of the elements of the chalcogen-containing semiconductor material. The chalcogen-containing absorber layer contains further elements of the at least one post-treatment material (PDT material, PDT=post deposition treatment) of the post-treatment layer (PDT layer) described in the following, whose relative material amounts in the absorber layer are indicated below. Preferably, the absorber layer contains no elements other than those of the chalcogen-containing semiconductor material and of the at least one post-treatment material, wherein, preferably, impurities that are possibly unavoidable for production technology reasons have a total relative material amount of a maximum of 1 at. %.

The semiconductor material of the absorber layer has doping of a first conductor type (charge carrier type) and the front electrode has doping of the opposite conductor type (charge carrier type). Typically, the absorber layer is p-conductive (p-doped), i.e., has an excess of defect electrons (holes); and the front electrode layer is n-conductive (n-doped) such that free electrons are present in excess.

At least one buffer layer is arranged between the absorber layer and the front electrode layer. The buffer layer can contain various buffer materials, in particular zinc oxysulfide Zn(O,S), zinc oxy-hydrogen sulfide Zn(O, OH, S), cadmium sulfide CdS, indium sulfide In$_x$S$_y$, and zinc magnesium oxide Zn$_{1-x}$Mg$_x$O. For example, the buffer layer consists of one single ply of sodium-doped indium sulfide (In$_2$S$_3$:Na) and one single ply of (undoped) intrinsic zinc oxide (i-ZnO). Particularly preferably, the buffer layer is based on Zn and contains zinc oxysulfide Zn(O,S) or zinc oxy-hydrogen sulfide Zn(O, OH, S).

Preferably, the buffer layer consists at the rate of at least 95 at. %, in particular at least 99 at. %, of the buffer specified in each case, with the above percentage values indicating the sum of the relative material amounts of the elements of the buffer. Preferably, the buffer layer contains no elements other than those of the buffer indicated in each case, wherein relative material amounts of different, additional elements (impurities), possibly unavoidable for production technology reasons, preferably amount in total to a maximum of 1 at. %.

The layer system thus has, arranged one atop another in the form of a stack, a back electrode layer, an absorber layer, at least one buffer layer, and a front electrode layer. In principle, all chemical-physical deposition processes are suitable for the deposition of the various layers.

Serially connected solar cells are formed in the layer system by patterning lines. Thus, at least the back electrode layer is subdivided by first patterning lines (P1-lines) into sections separated from one another, which sections form the back electrodes of the solar cells. Also, at least the absorber layer is subdivided by second patterning lines (P2-lines) into sections separated from one another, which sections form the absorbers of the solar cells, and at least the front electrode layer is subdivided by third patterning lines (P3-lines) into sections separated from one another, which sections form the front electrodes of the solar cells. Adjacent solar cells are electrically connected to one another in serial connection via electrically conductive material in the second patterning lines, wherein the front electrode of one solar cell is electrically connected to the back electrode of the adjacent solar cell and, typically, but not mandatorily, makes direct physical contact therewith. Each patterning zone comprises a direct succession of the three patterning lines P1-P2-P3, in this order in each case.

In keeping with the customary usage, the term "solar cell" refers to a region of the layer system that has a front electrode, a photovoltaically active absorber, and a back electrode and is delimited by two patterning zones directly adjacent one another. This applies analogously in the edge region of the module, wherein, instead of a patterning zone, there is a connection section for electrically contacting the serial connection of the solar cells.

The method according to the invention for the post-treatment of a chalcogen-containing absorber layer comprises, first, providing a chalcogen-containing absorber layer on a carrier. The chalcogen-containing absorber layer and the carrier can, in particular, be implemented as stated above. Preferably, the absorber layer includes a chalcogen-containing chalcopyrite compound semiconductor or a chalcogen-containing kesterite compound semiconductor, wherein the crystal formation of the semiconductor material has already been completed. In other words, a semiconductor material that is based on a chalcopyrite or kesterite compound semiconductor has already completely reacted as a result of heating to form the compound semiconductor such that the crystal formation (and phase transformation) is complete.

Then, a layer serving for the post-treatment of the absorber layer, referred to in the following as the "post-treatment layer", is applied on a surface of the absorber layer (the exposed surface of the absorber layer facing away from the carrier). The post-treatment layer contains at least one material, referred to in the following as "post-treatment material", which is selected from the group of post-treatment materials, consisting of a metal chalcogenide, an oxygen compound of a metal chalcogenide, and a hydrogen-oxygen compound of a metal chalcogenide, in particular of the oxidation states IV or VI. Advantageous post-treatment materials are $Met_xCh$, $Met_xHChO_3$, $Met_xChO_3$, $Met_xHChO_4$, and $Met_xChO_4$, where "Met" indicates the metal and "Ch" the chalcogen in the respective oxidation state. The post-treatment layer is deposited directly (i.e., without an intermediate layer) on the absorber layer. The at least one post-treatment material is not a buffer or a component of a buffer and, thus, has no buffering effect. The at least one post-treatment material does not serve for producing a buffer. In particular, the at least one post-treatment material is not applied as a component for producing a buffer. Contrary to US 2016/0163905 A1, the at least one post-treatment material is not combined with at least one further substance, in particular, not with indium or a indium-containing composition, to produce a buffer.

In one embodiment of the invention, for producing the post-treatment layer, exactly one post-treatment material with exactly one alkali chalcogenide, exactly one oxygen compound of an alkali chalcogenide, or exactly one hydrogen-oxygen compound of an alkali chalcogenide is applied on the absorber layer. In this case, exactly one alkali element (not a plurality of alkali elements) is chemically bound in the post-treatment material.

The post-treatment layer or the at least one post-treatment material is deposited on the absorber layer by a physical or chemical deposition method, preferably by thermal evaporation, wet-chemical bath deposition, electron beam evaporation, sputtering, atomic layer deposition, or spray pyrolysis.

Advantageously, the at least one post-treatment material is selected from the group of post-treatment materials consisting of an alkali sulfide, in particular $Na_2S$, $K_2S$, $Rb_2S$, $Cs_2S$; an alkaline earth sulfide, in particular MgS, CaS; a hydrogen-oxygen compound of a metal chalcogenide with the oxidation state IV, in particular $NaHSO_3$, $KHSO_3$, $RbHSO_3$, $CsHSO_3$; an oxygen compound of a metal chalcogenide with the oxidation state IV, in particular $Na_2SO_3$, $K_2SO_3$, $Rb_2SO_3$, $Cs_2SO_3$; a hydrogen-oxygen compound of a metal chalcogenide with the oxidation state VI, in particular $NaHSO_4$, $KHSO_4$, $RbHSO_4$, $CsHSO_4$; and an oxygen compound of a metal chalcogenide with the oxidation state VI, in particular $Na_2SO_4$, $K_2SO_4$, $Rb_2SO_4$, $Cs_2SO_4$.

Preferably, the post-treatment layer consists, at a rate of at least 95 at. %, preferably of at least 99 at. %, of the at least one post-treatment material, wherein the above percentage values indicate the total of the relative material amounts of the elements of the at least one post-treatment material. Preferably, the post-treatment layer contains no elements other than those of the at least one post-treatment material, wherein relative material amounts of further elements (impurities) other than those that are possibly unavoidable for production technology reasons, preferably amount, in total, to a maximum of 1 at. %.

The at least one post-treatment material of the post-treatment layer applied on the absorber layer is thermally diffused into the absorber layer. The diffusion of the post-treatment material into the absorber layer is done by increasing the temperature (tempering) of the post-treatment layer, which is heated for this purpose by external energy input.

According to one embodiment of the invention, in which the post-treatment layer is in thermal equilibrium with the carrier (i.e., the temperatures of the post-treatment layer and the carrier are at least approx, the same), the post-treatment layer is heated for this purpose to a temperature in the range from 70° C. to 700° C., preferably 150° C. to 700° C., preferably for a heating time in the range from 1 min to 120 min.

According to another embodiment of the invention, in which the post-treatment layer is not in thermal equilibrium with the carrier (i.e., the temperatures of the post-treatment layer and the carrier are substantially different), the post-treatment layer is heated by heating pulses, wherein the energy input is in the range from 0.5 $J/cm^2$ to 15 $J/cm^2$ (relative to the area of the post-treatment layer), preferably with a pulse duration of the heating pulses in the range from 0.2 msec to 20 msec. The heating pulses are advantageously generated by a flash lamp or a laser.

According to another embodiment of the invention, the post-treatment layer is deposited on a carrier whose temperature is in the range from 300° C. to 800° C. When using a chalcopyrite or kesterite compound semiconductor, the carrier can still have a high temperature, in particular as a result of the prior thermal conversion of the precursor layer to form the compound semiconductor. The post-treatment layer is accordingly applied to the absorber layer a short time after crystallization of the compound semiconductor. In this case, the post-treatment layer has already been heated by the carrier to such a temperature that sufficient diffusion of the at least one post-treatment material into the absorber layer results. Advantageously, no further heating of the carrier is necessary. However, it is also possible to feed additional energy to the post-treatment layer on the hot carrier, for example, to maintain a high temperature of the post-treatment layer (and of the carrier) and to avoid passive cooling or to further increase the temperature of the post-treatment layer.

According to the invention, just by using at least one post-treatment material, preferably metal chalcogenides, especially alkali sulfides, both passivation of the absorber layer by the alkali metal and also surface termination of the absorber layer by the chalcogen can advantageously be achieved. In particular, passivation of grain boundaries and/or of electrically active defects occurs through the addition of the alkali metal. In addition, an enlargement of the surface band gap of the semiconductor material can be achieved, by means of which electronic band matching between the absorber layer in the buffer layer is optimized and charge carrier recombination is reduced. As a result, a reduction in the charge carrier recombination at the buffer layer/absorber layer interface and in the space charge zone of the absorber layer can be achieved. The post-treatment material thus has a dual function that entails very advantageous effects, as is discernible from various solar parameters. This improves the efficiency of the solar cells, increases the open clamping voltage, and improves the fill factor. It has also been demonstrated that with an absorber layer that had been post-treated according to the invention, the layer thickness of the buffer layer can be reduced, which is advantageously accompanied by an increase in the short-circuit current density due to lower absorption of the incident sunlight in the buffer layer.

Preferably, the absorber layer has, after the thermally-induced diffusion of the at least one post-treatment material into the absorber layer, a metal substance amount of the post-treatment material in the range from 0.02 at. % to 2.5 at. %, in particular preferably in the range 0.1 at. % to 1.3 at. %, relative to the total amount of material of the absorber layer. Thus, the various solar parameters, in particular the efficiency, can be improved particularly well.

As already mentioned, a chalcogen is added to the absorber layer by the at least one post-treatment material. Thus, the diffusion of the at least one post-treatment material into the absorber layer can, in principle, be done in a chalcogen-free atmosphere, consisting, for example, of inert gas.

According to an alternative embodiment of the method according to the invention, the thermally-induced diffusion of the at least one post-treatment material into the absorber layer is done in an atmosphere containing at least one chalcogen, whereby the amount of chalcogen diffused into the absorber layer can be further increased without simultaneously increasing the amount of alkali metal. The two effects of passivation by the alkali metal and surface termination by the chalcogen can thus also be controlled independently of each other, with the effects of the surface termination capable of being further increased selectively.

The diffusion of the at least one post-treatment material into the absorber layer occurs in a chalcogen-containing atmosphere or in a chalcogen-free atmosphere, in particular inert gas, for example, when the post-treatment layer is applied on a hot substrate (carrier with absorber layer) with a temperature in the range from 300° C. to 700° C.

The at least one post-treatment material can, for example, even be thermally diffused into the absorber layer under atmospheric pressure. In an advantageous embodiment of the method according to the invention, the diffusion of the at least one post-treatment material into the absorber layer is done in an evacuated environment, which has the advantage that undesirable impurities of the absorber layer from the surrounding atmosphere can be avoided.

In another advantageous embodiment of the method according to the invention, after the diffusion of the at least one post-treatment material into the absorber layer, the surface of the absorber layer is cleaned, wherein the post-treatment material present on the surface of the absorber layer (i.e. the non-diffused post-treatment material) is preferably removed, in particular removed in total from the surface of the absorber layer. The cleaning is performed by physical and/or chemical, dry and/or wet cleaning processes, in particular by rinsing with a gaseous or liquid fluid and/or irradiation with UV light and/or by means of plasma.

Possible cleaning methods are, for example, rinsing with deionized water, rinsing in acid solutions, rinsing in basic solutions, dry UV cleaning, dry UV cleaning with ozone, and plasma cleaning. One or more cleaning methods can be used to clean the surface of the absorber layer. As experiments by the inventors have demonstrated, the advantageous effects described can be even further improved by these measures, as is also shown by the solar parameters. In particular, non-diffused residues of the post-treatment layer on the surface of the absorber layer can be removed by surface cleaning. Accordingly, the method of the invention preferably comprises a step in which the at least one post-treatment material which remains on the surface of the absorber layer after the diffusion of the post-treatment material into the absorber layer is removed from the surface of the absorber layer. As a result, preferably no post-treatment material is present on the surface of the absorber layer after cleaning of the surface of the absorber layer.

According to an embodiment of the method, cleaning of the surface of the absorber layer (i.e. removing of the at least one post-treatment material from the surface of the absorber layer) is performed by chemical bath deposition (CBD) of a buffer layer on the absorber layer.

The invention further extends to a method for producing a layer system for the production of thin-film solar cells, comprising:
Providing a carrier,
Producing a back electrode layer on the carrier,
Producing a chalcogen-containing absorber layer,
Producing at least one buffer layer on the chalcogen-containing absorber layer,
Producing a front electrode layer on the buffer layer, wherein the chalcogen-containing absorber layer is post-treated in accordance with the above method according to the invention.

The components of the layer system can be produced as described above for thin-film solar cells. In particular, the buffer layer can be applied on the absorber layer by wet-chemical bath deposition (CBD), atomic layer deposition (ALD), ion layer gas deposition (ILGAR), spray pyrolysis, chemical vapor deposition (CVD), or physical vapor deposition (PVD). Preferably, the buffer layer is deposited directly, i.e., without an intermediate layer, on the absorber layer post-treated according to the invention.

Preferably, the buffer layer contains:
zinc oxysulfide, Zn(O,S), with all deposition methods, preferably sputtering with all compositions of S/(S+O);
zinc oxy-hydrogen sulfide Zn(O, OH, S), with CBD deposition methods;
cadmium sulfide, CdS, with all deposition methods;
indium sulfide, $In_xS_y$, with all deposition methods;
zinc magnesium oxide, $Zn_{1-x}Mg_xO$, with all deposition methods.

The buffer layer can be produced by a physical or chemical deposition method; according to a particularly advantageous embodiment of the method according to the invention, the buffer layer is deposited in an evacuated environment, for example, by sputtering (cathodic sputtering), thermal evaporation, or electron beam evaporation. The deposition of the buffer layer with a vacuum method has the particular advantage that, in a vacuum, the incorporation of hydroxide or additional oxygen into the buffer layer is prevented. Hydroxide components in the buffer layer are presumably responsible for efficiency transients under the influence of heat and light. In addition, vacuum methods have the advantage that the method works without wet chemistry and standard vacuum coating equipment can be used. Through the use of a vacuum method, possible surface Ga depletion of a Cu(In,Ga) (S,Se)$_2$ absorber layer through deposition of a buffer layer by means of chemical bath deposition (CBD) is avoided. Particularly advantageously, a buffer layer containing zinc oxysulfide, Zn(O,S), is applied on the absorber layer by sputtering.

In addition, the invention extends to the use of the method according to the invention for post-treating an absorber layer in the production of a layer system for the production of thin-film solar cells.

The various embodiments of the invention can be realized individually or in any combinations. In particular, the features mentioned above and to be explained in the following can be used not only in the combinations indicated, but also in other combinations or in isolation, without departing from the scope of the present invention.

BRIEF DESCRIPTION OF THE DRAWINGS

The invention is now explained in detail with reference to the accompanying figures. They depict.

DETAILED DESCRIPTION OF THE DRAWINGS

For the tests described below, the results of which are presented in diagrams, thin-film solar cells or thin-film solar modules that are based on a layer system with the following layers were produced:

A back electrode layer made of molybdenum (Mo) was applied on a carrier made of glass. A CIGSSe absorber layer was produced on the back electrode layer (by deposition of a precursor layer, containing copper, indium, gallium, Se and thermal conversion of the precursor layer in an RTP process to form the compound semiconductor in an S-containing atmosphere). A buffer layer was deposited on the CIGSSe absorber layer. In the layer systems for post-treatment according to the present invention (FIG. en to 13), a zinc oxysulfide buffer layer, abbreviated Zn(O,S), in particular a mixture of ZnO/ZnS, deposited by sputtering on the CIGSSe absorber layer, was used. A front electrode layer of aluminum-doped zinc oxide (ZnO) was deposited on the buffer layer. Used for post-treatment of the CIGSSe absorber layer was a metal chalcogenide, specifically an alkali sulfide (here, for example, sodium sulfide, Na$_2$S), that had been deposited on the CIGSSe absorber layer after its crystallization. The diffusion of the sodium sulfide into the CIGSSe absorber layer was done in a furnace at a temperature in the range of 300°, wherein the carrier glass was in thermal equilibrium with the post-treatment layer. Optionally, the surface of the CIGSSe absorber layer was cleaned before the deposition of the buffer layer (here, for example, by rinsing with deionized water).

Figure 1:
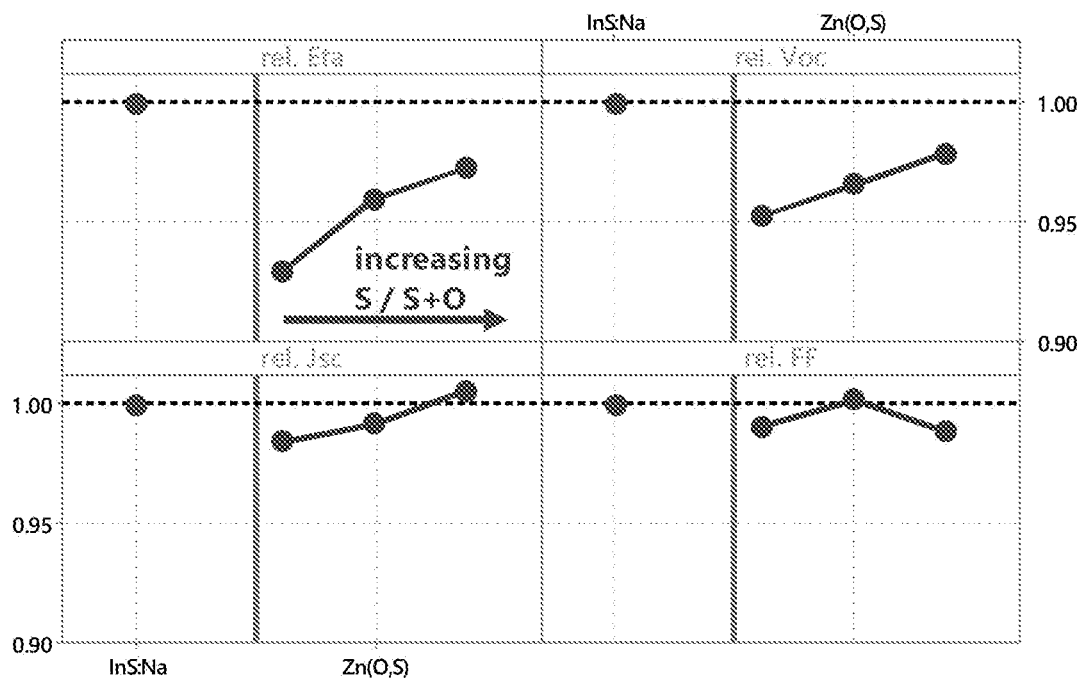
FIG. 1 diagrams showing relative solar parameters for solar cells with different Zn(O,S) buffer layers without post-treatment of the absorber layer according to the invention.

Consider first FIG. 1, which describes the prior art. Previously, it has been shown that the efficiency of thin-film solar cells with a Zn(O,S) buffer layer is always lower than that of cells with a In$_x$S$_y$ buffer layer. With the objective of avoiding this reduction in efficiency, three different S/(S+O) ratios of the Zn(O,S) buffer layer were tested in FIG. 1.

FIG. 1 shows, with four diagrams, the relative solar parameters of relative efficiency Eta, relative open clamping voltage Voc, relative short-circuit current density Jsc, and relative fill factor FF of solar cells with different Zn(O,S) buffer layers, in each case based on a Na-doped InS buffer layer. The Cu(In,Ga) (S,Se)$_2$ absorber layer was not subjected to any post-treatment according to the invention. The Zn(O,S) buffer layers were differentiated by the different S/(S+O) proportions, with the proportion of S/(S+O) increasing from left to right. The values for the solar parameters of the solar cell with the Na-doped In$_x$S$_y$ buffer layer served as a reference and are plotted in each diagram as a horizontal line.

As can be seen from the diagrams, the efficiency Eta and the open clamping voltage Voc for the solar cells with the Zn(O,S) buffer layer are lower for all S/(S+O) ratios than the corresponding solar parameters for the solar cell with the Na-doped InS buffer layer. With the highest value or the mean value of the S/(S+O) ratio of the Zn(O,S) buffer layer, an approx. equal value for the corresponding solar parameters of the solar cell with the Na-doped InS buffer layer can be achieved in each case for the short-circuit current density Jsc or the fill factor FF. As a result, it should be noted that even by changing the S/(S+O) ratio of the Zn(O,S) buffer layer, no sufficient improvement of the solar parameters can be achieved.

Figure 2:
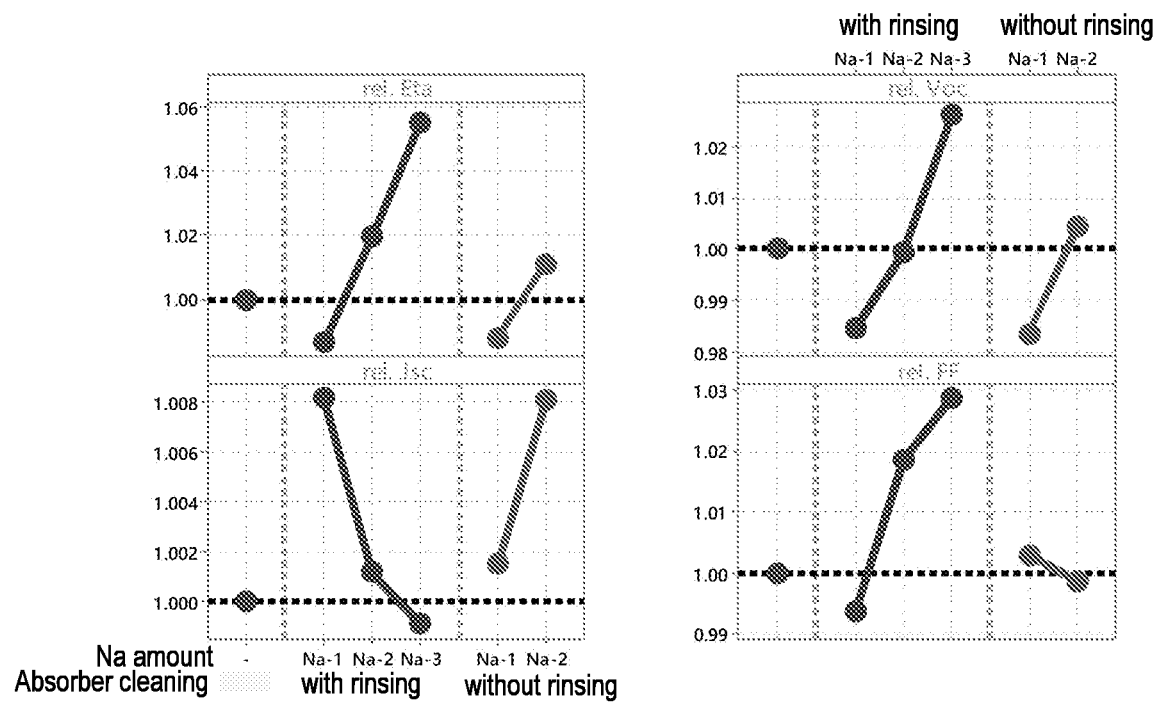
FIG. 2 diagrams showing relative solar parameters for solar cells with differently post-treated absorber layers with Zn(O,S) buffer, with and without rinsing of the absorber layer.

The effect of the post-treatment of the absorber layer according to the invention with and without rinsing of the absorber layer before deposition of the buffer layer is discernible from FIG. 2. FIG. 2 shows, analogously to FIG. 1, the relative solar parameters of relative efficiency Eta, relative open clamping voltage Voc, relative short-circuit current density Jsc, and relative fill factor FF for solar cells with differently post-treated absorber layers with Zn(O,S) buffer, wherein the absorber layer was subjected to a post-treatment according to the invention, in each case based on a Zn(O,S) buffer layer that was applied on an absorber layer that was not post-treated. The sub-diagrams on the left refer in each case to the Zn(O,S) buffer layer on a non-treated absorber layer. The center sub-diagrams refer to Zn(O,S) buffer layers, wherein the surface of the absorber layer was subjected to surface cleaning after the diffusion of the sodium sulfide and before the application of the respective Zn(O,S) buffer layer. Three differently post-treated absorber layers with different Na content are shown, with the Na content increasing from left to right (Na-3>Na-2>Na-1). The sub-diagrams on the right refer to differently post-treated absorber layers with Zn(O,S) buffer, wherein the surfaces of the absorber layers were not cleaned before the application of the respective Zn(O,S) buffer layer. For this case, two differently post-treated absorber layers with different Na content are shown in each case, with the Na content increasing from left to right (Na-2>Na-1).

FIG. 2 shows that for the smallest amount of sodium (Na-1) in both cases (with and without rinsing of the absorber layer), a slight decrease in efficiency occurs in each case compared to the absorber layer without post-treatment. Only with a larger amount of sodium is the advantageous effect on the efficiency Eta, as well as the open clamping voltage Voc and the fill factor FF seen. A further improvement of the solar parameters can be achieved by cleaning the surface of the absorber layer. When the surface of the absorber layer is not cleaned, there is already a decrease in the fill factor FF with the use of a moderate amount of sodium (Na-2).

Figure 3:
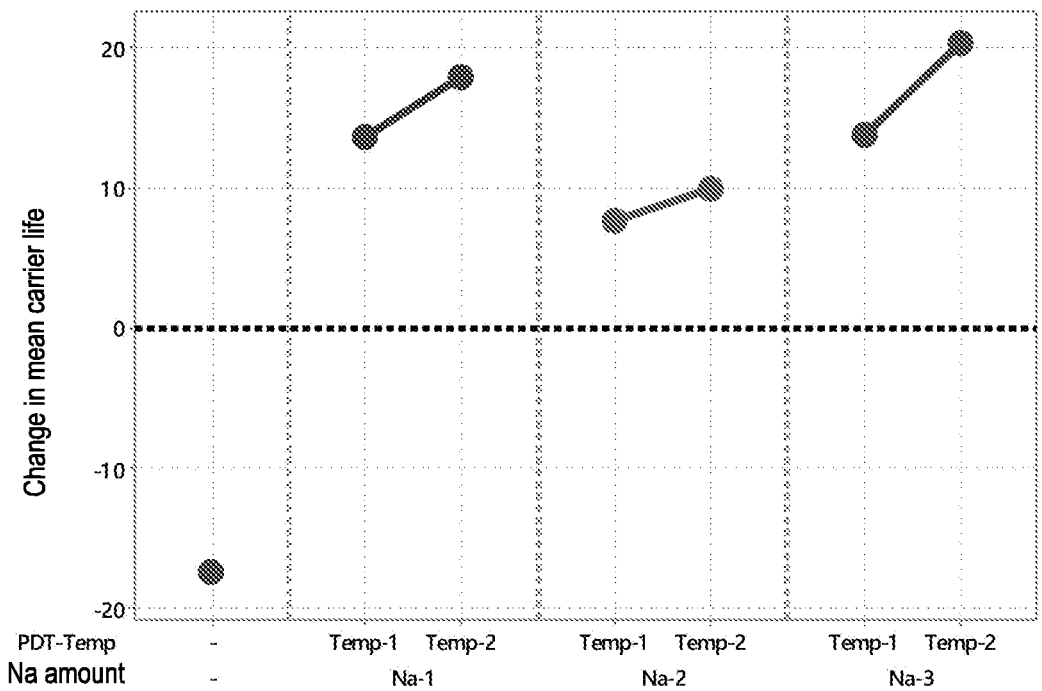
FIG. 3 a diagram showing the change in the mean charge carrier service life after application of the Zn(O,S) buffer layer on the absorber layer for various Na amounts and various post-treatment temperatures.

The effect of the post-treatment according to the invention in the absorber layer or at the buffer layer/absorber layer interface can even be determined directly in a change in the mean charge carrier service life from a time-dependent photoluminescence measurement with and without post-treatment of the absorber layer according to the invention. FIG. 3 shows a diagram, in which the change in the mean charge carrier service life after application of the Zn(O,S) buffer layer on the absorber layer is shown for three different Na amounts Na-1 (second sub-diagram from the left), Na-2 (third sub-diagram from the left), and Na-3 (fourth sub-diagram from the left), based in each case on the mean charge carrier service life of the layer system without a buffer layer (absorber layer+back electrode layer+carrier). As a reference, the mean charge carrier service life of the layer system with a buffer layer, but without post-treatment of the absorber layer according to the invention is indicated (first sub-diagram on the left). The Na amount increases from left to right, i.e., Na-3>Na-2>Na-1. For each Na amount, the diffusion of the post-treatment material was carried out at two different (furnace) temperatures Temp-1, Temp-2, where Temp-2>Temp-1. The surface of the absorber layer was cleaned, before the Zn(O,S) buffer layer was applied.

FIG. 3 shows that the change in the mean charge carrier service life without post-treatment according to the invention is negative, in other words, the mean charge carrier service life is reduced after application of the Zn(O,S) buffer, whereas the change in the mean charge carrier service life with post-treatment according to the invention is positive, in other words, the mean charge carrier service life is increased after application of the Zn(O,S) buffer on the post-treated absorber layer. With the same amount of Na in each case, with post-treatment of the absorber layer according to the invention, an increase in the change in the charge carrier service life occurs with an increase in the temperature with the tempering of the the post-treatment material.

Figure 4:
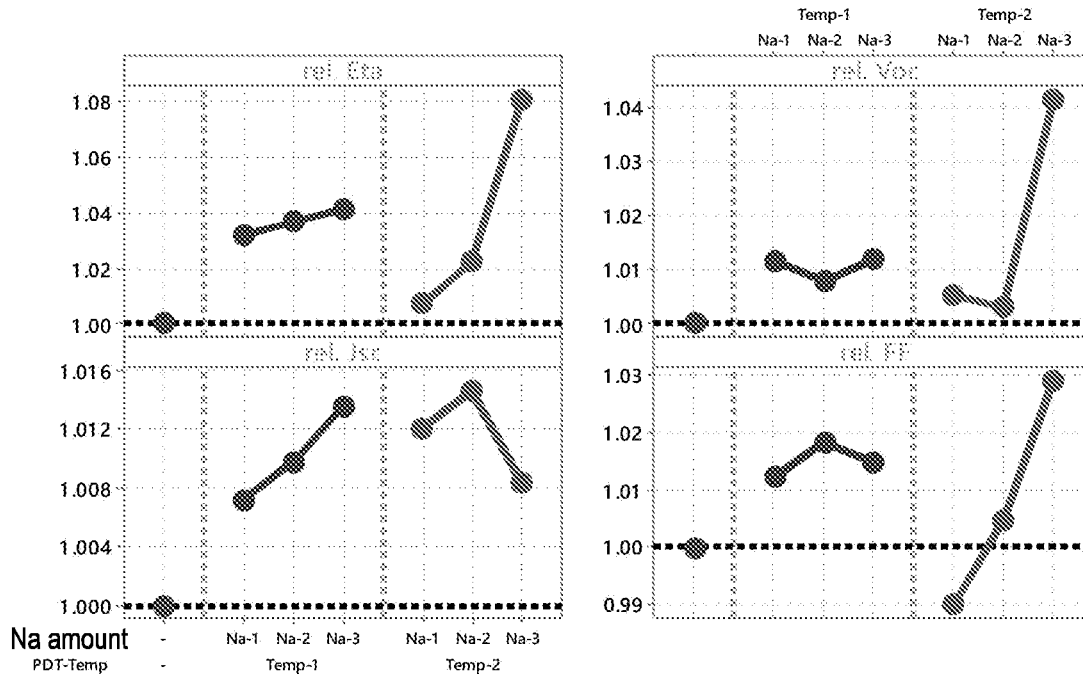
FIG. 4 diagrams showing relative solar parameters for solar cells with differently post-treated absorber layers with Zn(O,S) buffer for various Na amounts and various post-treatment temperatures.

The achievable efficiency is a function of the alkali amount and the temperature of the post-treatment layer at the time of diffusion of the post-treatment material into the absorber layer. FIG. 4 shows the relative solar parameters of relative efficiency Eta, relative open clamping voltage Voc, relative short-circuit current density Jsc, and relative fill factor FF for solar cells with differently post-treated absorber layers with Zn(O,S) buffer, based in each case on a solar cell with Zn(O,S) buffer, which is applied on an absorber layer not post-treated according to the invention. The left sub-diagrams refer in each case to a Zn(O,S) buffer layer that was applied on a non-post-treated absorber layer. The center sub-diagrams refer to Zn(O,S) buffer layers, wherein the surface of the absorber layer was subjected to surface cleaning after the diffusion of the sodium sulfide and before the application of the respective Zn(O,S) buffer layer. Three differently post-treated absorber layers with Zn(O,S) buffer with different Na content (originating from the sodium sulfide) are shown, wherein the Na content increases from left to right (Na-3>Na-2>Na-1). In the center sub-diagrams, the post-treatment of the absorber layer was carried out at a temperature Temp-1. The right sub-diagrams refer to Zn(O,S) buffer layers, wherein the surface of the absorber layer was subjected to cleaning after the diffusion of sodium sulfide and before the application of the respective Zn(O,S) buffer layer. Three differently post-treated absorber layers with different Na content are shown, wherein the Na content increases from left to right (Na-3>Na-2>Na-1). In the right sub-diagrams, the post-treatment of the absorber layer was carried out at a temperature Temp-2, where Temp-2>Temp-1.

The improvement of the efficiency of a solar cell with a Zn(O,S) buffer layer through the post-treatment of the absorber layer according to the invention exhibits both a dependence on the alkali amount and the temperature used during the post-treatment (carrier temperature, furnace temperature). No saturation of the effect of the post-treatment is discernible; an increase in temperature with an increase in the Na amount appears particularly advantageous.

Figure 5:
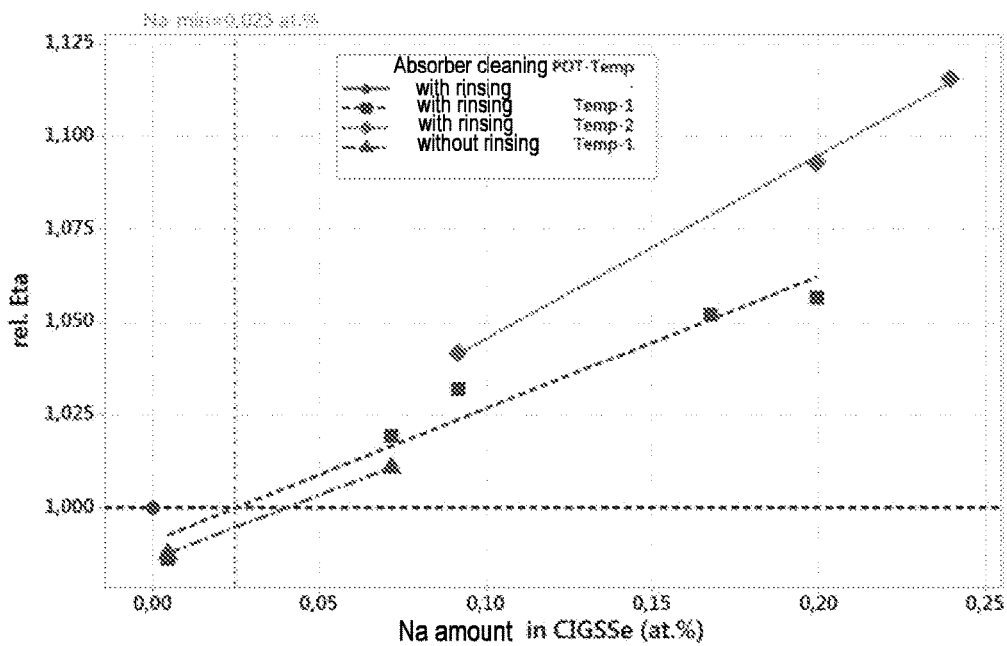
FIG. 5 a diagram showing the relative efficiency of solar cells as a function of the Na amount for various post-treatment temperatures as well as with and without rinsing of the absorber layer.

FIG. 5 shows the influence of the Na amount on the relative efficiency Eta. Various measured values are shown for a solar cell with a Zn(O,S) buffer layer that was applied on an absorber layer post-treated according to the invention, wherein the absorber layer had been cleaned or had not been cleaned before the application. Serving as a reference (horizontal line for relative efficiency rel. Eta=1) was a solar cell with a Zn(O,S) buffer layer that had been applied on an absorber layer not post-treated according to the invention, wherein the absorber layer was cleaned in the same manner before the application of the Zn(O,S) buffer layer. As shown in FIG. 5, an improvement in efficiency can already be achieved with an alkali amount of at least 0.02 at. % in the absorber layer.

Figure 6:
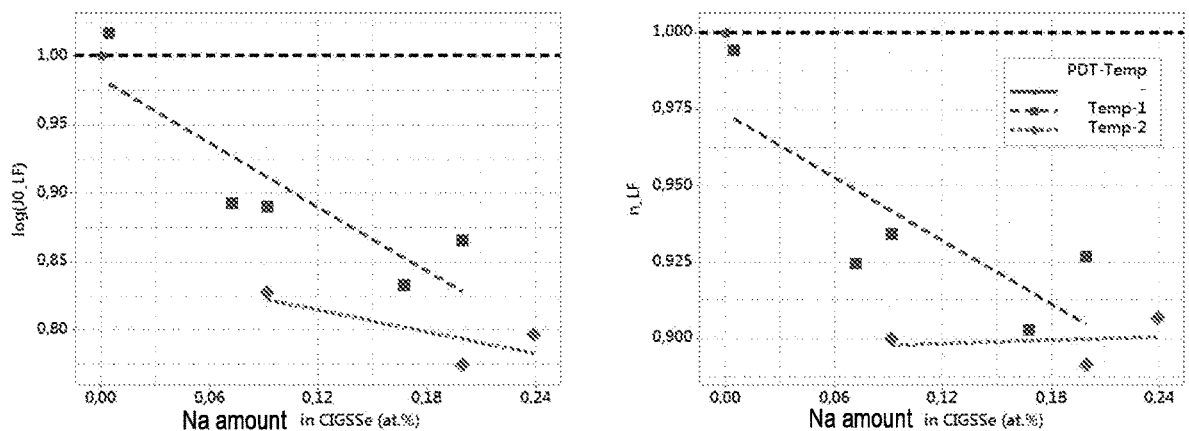
FIG. 6 diagrams showing relative secondary solar parameters (saturation current density JO and diode ideality factor n) for solar cells with Zn(O,S) buffer without and with post-treatment of the absorber layer according to the invention for various Na amounts and various post-treatment temperatures.

FIG. 6 shows relative secondary solar parameters (saturation current density JO and diode ideality factor n) for solar cells with Zn(O,S) buffer without post-treatment according to the invention and with post-treatment of the absorber layer according to the invention for various Na amounts, as well as three different post-treatment temperatures Temp-1, Temp-2, and Temp-3, where Temp-3>Temp-2>Temp-1. The surface of the absorber layer was cleaned in each case before deposition of the Zn(O,S) buffer layers. Saturation current density and diode ideality factor were obtained by modeling the measured I-V characteristic curve according to the one-diode model. High values of these secondary solar parameters indicate increased recombination in the region of the absorber/buffer junction. As a result of the post-treatment of the absorber layer according to the invention, the recombination of the charge carriers in the region of the absorber/buffer junction is significantly reduced.

Figure 7:
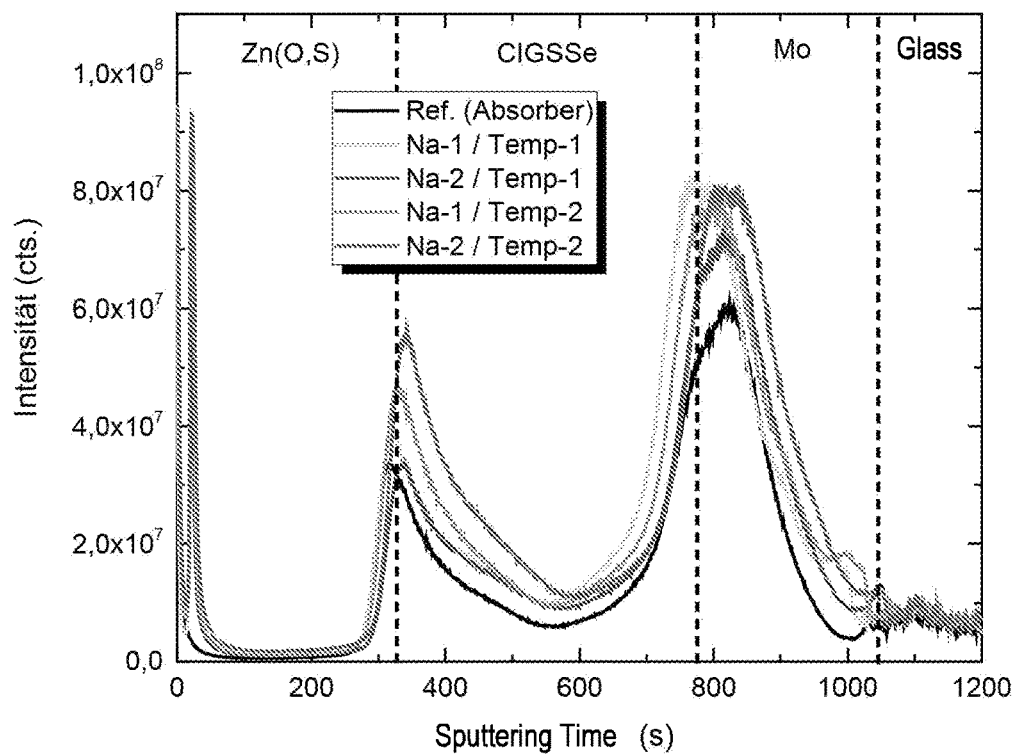
FIG. 7 a diagram showing TOF-SIMS Na profiles of the buffer layer and absorber layer without and with post-treatment of the absorber layer according to the invention for various Na amounts and various post-treatment temperatures.

FIG. 7 shows TOF-SIMS Na profiles of the buffer layer and the absorber layer without post-treatment of the absorber layer according to the invention and with post-treatment of the absorber layer according to the invention for two different Na amounts N-1 and Na-2, where Na-2>Na-1, and for two different post-treatment temperatures Temp-1 and Temp-2, where Temp-2>Temp-1. The signal intensity is plotted against the sputtering time.

Accordingly, there is an increase in the Na amount in the buffer layer/absorber layer interface region with increasing Na amount and/or temperature, which extends far into the absorber depth. Also, at the transition of the CIGSSe absorber layer to the molybdenum-based back contact, there is an increase in the Na signals in TOF-SIMS compared to the reference layer; however, here, the incorporation seems to be driven more by solubility of the sodium in the layers involved since there is little dependence on the Na amount and/or the temperature of the post-treatment of the absorber layer.

The absorber layer has, after application and tempering of the post-treatment material, without cleaning of the absorber surface, various additional properties.

Figure 8:
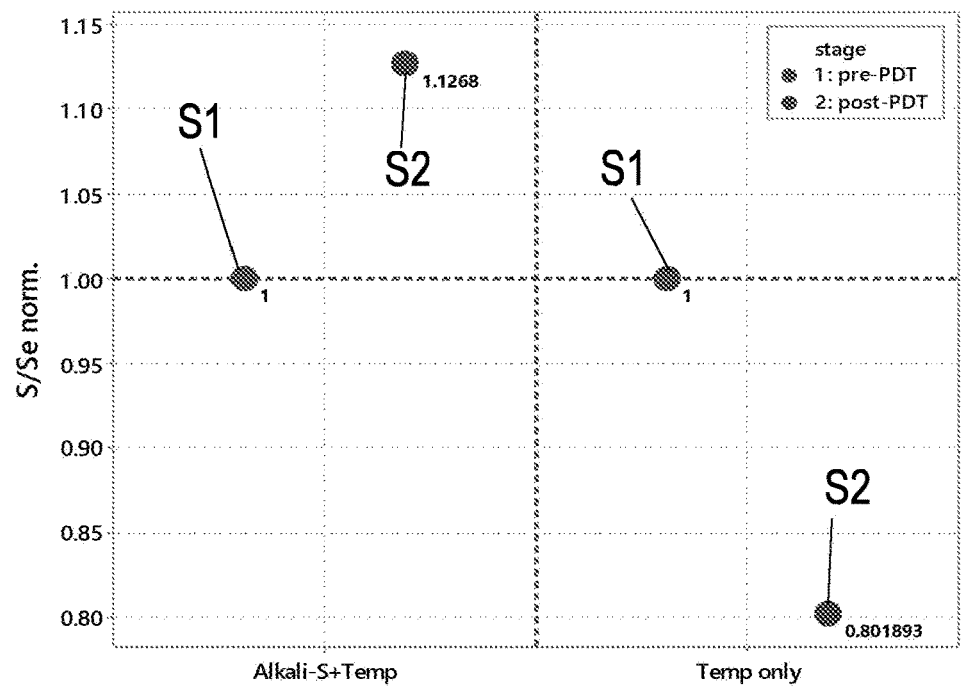
FIG. 8 a diagram showing a surface S-correlated Raman signal for CIGSSe absorber surfaces without surface cleaning.

FIG. 8 shows the surface S-correlated Raman signal for CIGSSe absorber surfaces. "Stage 1" refers to the state before the post-treatment according to the invention; "Stage 2", to the state after the post-treatment according to the invention or after the tempering of the absorber layer. The measurement points for Stage 1 are marked with "S1"; the measurement points for Stage 2, with "S2".

Accordingly, the surface S-correlated Raman signal for the absorber layer with alkali sulfide application and tempering shows a significant increase of 13%_rel in comparison with an absorber layer without alkali sulfide tempered in a comparable atmosphere (vacuum), which loses 20%_rel of the Raman signal, in each case relative to the signal intensity of the absorber surface before post-treatment according to the invention or tempering.

Figure 9:
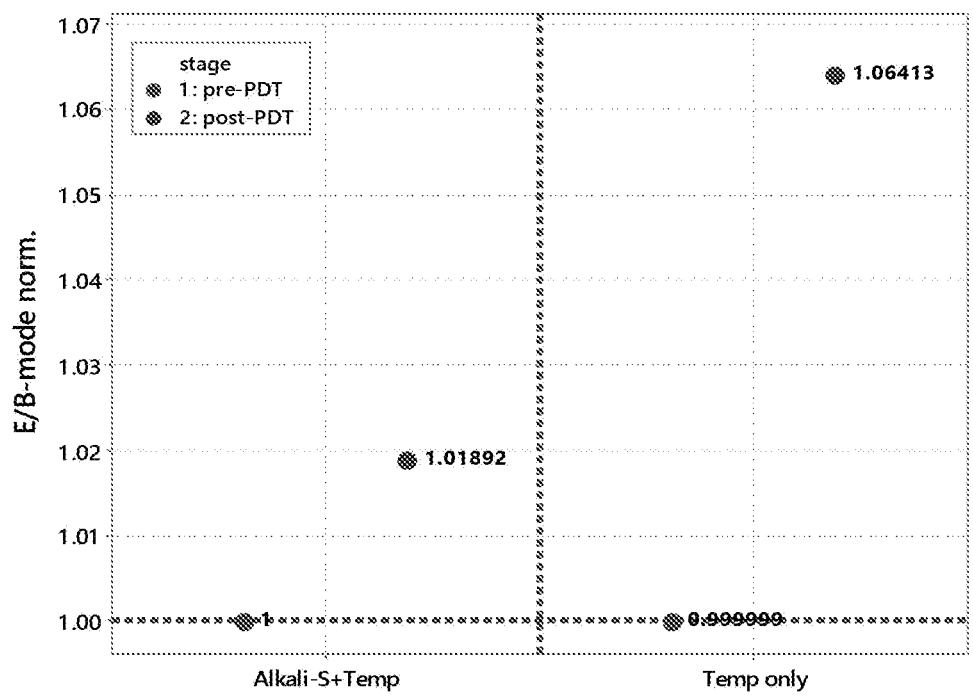
FIG. 9 a diagram showing a CIG-correlated Raman signal for CIGSSe absorber surfaces without surface cleaning.

FIG. 9 shows the CIG-correlated Raman signal for CIGSSe absorber surfaces. "Stage 1" refers to the state before the post-treatment according to the invention; "Stage 2", to the state after post-treatment according to the invention or after tempering. The measurement points for Stage 1 are marked with "S1"; the measurement points for Stage 2, with "S2".

Accordingly, the surface CIG-ratio-correlated Raman signal for the absorber layer with alkali sulfide post-treatment shows less change than for the tempered-only absorber layer. An increase in the Raman signal would be an indication of an increase in the surface Cu/In+Ga (CIG) ratio.

Figure 10:
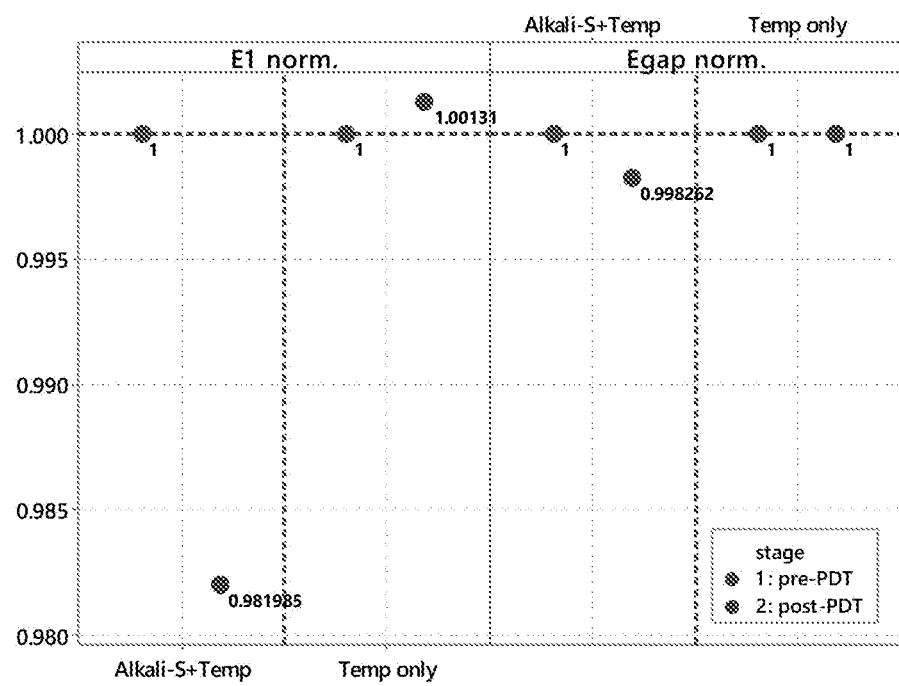
FIG. 10 a diagram showing a reflectometry evaluation for CIGSSe absorber surfaces without surface cleaning.

FIG. 10 shows a reflectometry evaluation for CIGSSe absorber surfaces. "E1" corresponds to a peak in the reflection spectrum that correlates with the surface band gap determined by the S/Se content in these absorbers. "Egap" corresponds to the minimum band gap in the absorber depth. "Stage 1" refers to the state before the post-treatment according to the invention; "Stage 2", to the state after post-treatment according to the invention or after tempering. The measurement points for Stage 1 are marked with "S1"; the measurement points for Stage 2, with "S2".

Accordingly, the E1 signal from the reflectometry (correlation with the surface band gap of the absorber) for the absorber with alkali sulfide post-treatment shows a significant reduction of the surface band gap, whereas the the tempered-only absorber has an unchanged surface band gap, relative in each case to the state before post-treatment or tempering.

After application and tempering of the post-treatment material, after the additional cleaning step of the absorber surface, e.g., by rinsing, the absorber layer has various additional properties.

Figure 11:
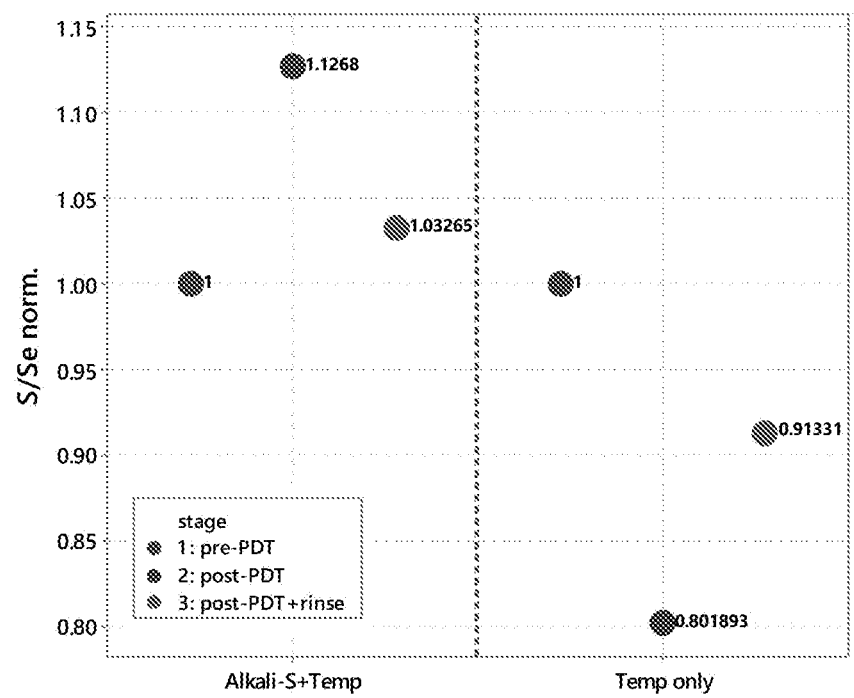
FIG. 11 a diagram showing a surface S-correlated Raman signal for CIGSSe absorber surfaces with surface cleaning.

FIG. 11 shows the surface S-correlated Raman signal for CIGSSe absorber surfaces. "Stage 1" refers to the state before the post-treatment according to the invention; "Stage 2", to the state after post-treatment according to the invention or after tempering; "Stage 3", to the state after alkali sulfide post-treatment or after tempering and an additional cleaning step of the absorber surface. The measurement points for Stage 1 are marked with "S1"; the measurement points for Stage 2, with "S2"; the measurement points for Stage 3, with "S3".

Accordingly, the surface S-correlated Raman signal for the absorber with alkali sulfide application and tempering shows, even after the cleaning step of the absorber surface, an increase compared to an absorber without alkali sulfide tempered in a comparable atmosphere (vacuum), relative in each case to the signal intensity of the absorber surface before post-treatment or tempering.

Figure 12:
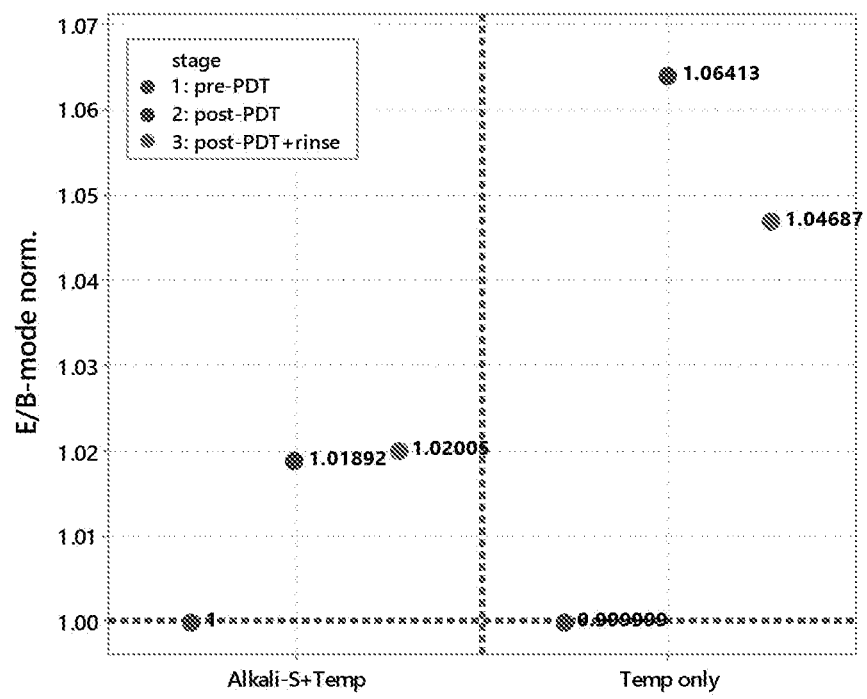
FIG. 12 a diagram showing a CIG-correlated Raman signal for CIGSSe absorber surfaces with surface cleaning.

FIG. 12 shows the CIG-correlated Raman signal for CIGSSe absorber surfaces. "Stage 1" refers to the state before the post-treatment according to the invention; "Stage 2", to the state after post-treatment according to the invention or after tempering; "Stage 3", to the state after alkali sulfide post-treatment or after tempering and an additional cleaning step of the absorber surface. The measurement points for Stage 1 are marked with "S1"; the measurement points for Stage 2, with "S2"; the measurement points for Stage 3, with "S3".

Accordingly, the surface CIG-ratio-correlated Raman signal shows, after the additional cleaning step of the absorber surface, no change for the absorber with the alkali sulfide post-treatment; in the case of the tempered-only absorber, a slight decrease in the Raman signal is to be noted. Overall, for the absorber with alkali sulfide post-treatment, the surface CIG ratio does not differ from that with the tempered-only absorber.

Figure 13:
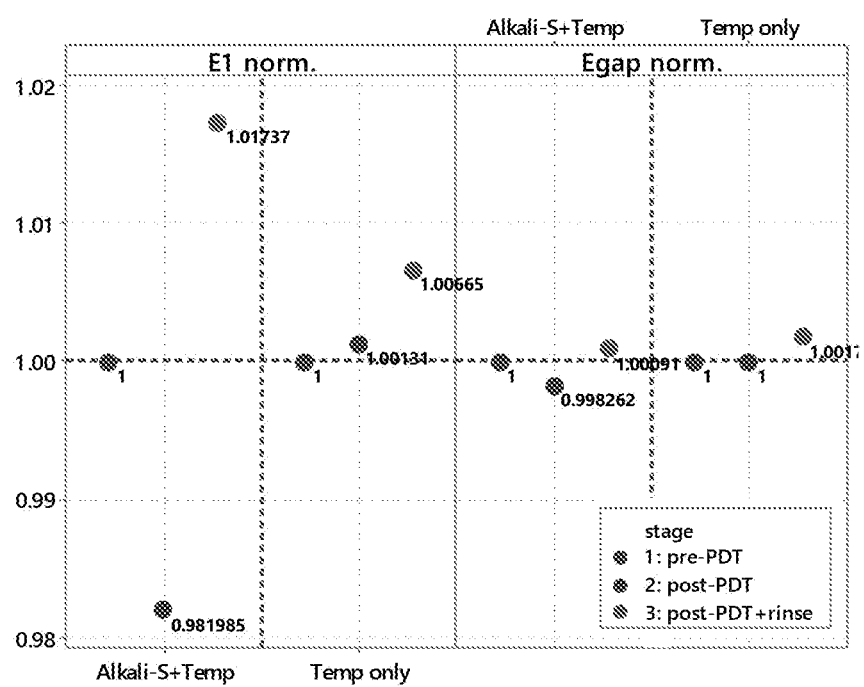
FIG. 13 a diagram showing a reflectometry evaluation for CIGSSe absorber surfaces with surface cleaning.

FIG. 13 shows a reflectometry evaluation for CIGSSe absorber surfaces. "E1" corresponds to a peak in the reflection spectrum that correlates with the surface band gap determined by the S/Se content in these absorbers. "Egap" corresponds to the minimum band gap in the absorber depth. "Stage 1" refers to the state before the post-treatment according to the invention; "Stage 2", to the state after post-treatment according to the invention or after tempering; "Stage 3", to the state after alkali sulfide post-treatment or after tempering and an additional cleaning step of the absorber surface. The measurement points for Stage 1 are marked with "S1"; the measurement points for Stage 2, with "S2"; the measurement points for Stage 3, with "S3".

Accordingly, the E1 signal from the reflectometry (correlation with the surface band gap of the absorber) for the absorber with alkali sulfide post-treatment shows a significant increase in the surface band gap only as a result of the additional cleaning step of the absorber surface, whereas the tempered-only absorber has an unchanged surface band gap even after the cleaning step, relative in each case to the state before post-treatment or tempering.

In the case of the sulfoselenide surface of the sequential absorber, it is only through the use according to the invention of an S-containing post-treatment material that S-depletion of the absorber surface can be prevented in the post-treatment process. Analogously, it can be concluded from this that in the case of an absorber with a purely selenide surface, an Se-containing post-treatment material must be used to prevent Se-depletion of the absorber surface in the post-treatment process.

Figure 14:
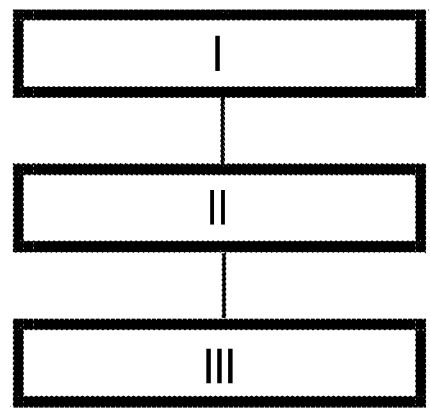
FIG. 14 a flowchart to illustrate the steps of the method according to the invention for post-treating an absorber layer.

FIG. 14 schematically illustrates, with reference to a flowchart, the method for post-treating an absorber layer of a layer system for the production of thin-film solar cells. First, in a first step I, a chalcogen-containing absorber layer on a carrier is provided. Next, in a second step II, a post-treatment layer is applied on a surface of the absorber layer, wherein the post-treatment layer contains at least one post-treatment material selected from the group consisting of a metal chalcogenide, an oxygen compound of a metal chalcogenide, and a hydrogen-oxygen compound of a metal chalcogenide. Then, in a third step III the at least one post-treatment material is thermally diffused into the absorber layer. Preferably, in an optional fourth step IV, the absorber surface is cleaned.

Figure 15:
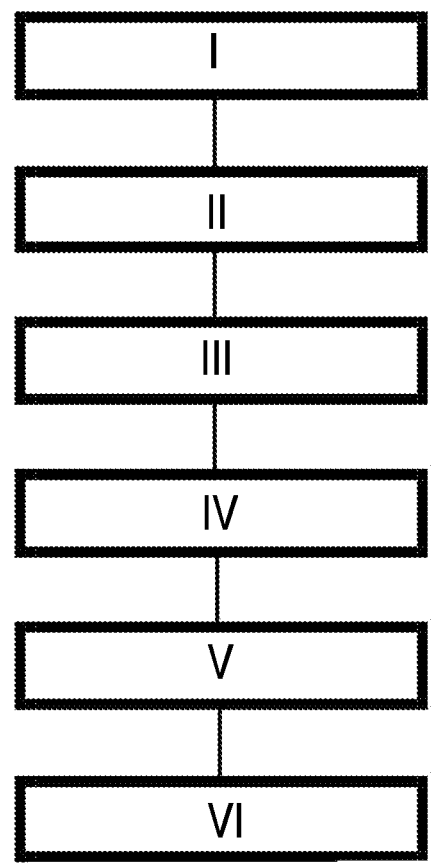
FIG. 15 a flowchart to illustrate the steps of the method according to the invention for producing a layer system for the production of thin-film solar cells, wherein a post-treatment of the absorber layer according to the invention is done.

FIG. 15 schematically illustrates, with reference to a flowchart, the method for producing a layer system for the production of thin-film solar cells, in which the absorber layer is post-treated according to the invention. First, in a first step I, a carrier is provided. In a second step II, a back electrode layer is produced on the carrier. In a third step III, a chalcogen-containing absorber layer is produced on the back electrode layer. In a fourth step IV, a post-treatment layer is applied on a surface of the absorber layer, wherein the post-treatment layer contains at least one post-treatment material selected from the group consisting of a metal chalcogenide, an oxygen compound of a metal chalcogenide, and a hydrogen-oxygen compound of a metal chalcogenide. Then, in a fifth step V, the at least one post-treatment material is thermally diffused into the absorber layer. In a sixth step VI, at least one buffer layer is produced on the absorber layer. Finally, in a seventh step VII, a front electrode layer is produced on the buffer layer. Preferably, in an optional step, the absorber surface is cleaned after the diffusion of the at least one post-treatment material and before the application of the buffer layer on the absorber layer.

It follows from the above statements that through the post-treatment of the absorber layer according to the invention, an improvement of the solar module parameters, in particular of the efficiency, of thin-film solar modules can advantageously be achieved. The post-treatment material has a dual function and serves simultaneously as a supplier of the alkali metal for alkali passivation of the absorber layer and also as a supplier of the chalcogen for surface termination of the absorber layer, in particular of Se for purely selenide co-evaporation absorbers and S for mixed sulfoselenide sequential absorbers. The post-treated absorber layer makes the use of buffer layers based on $Zn(O,S)$ economically viable and enables, in particular, the use of a vacuum method for the deposition of the buffer layer. This significantly facilitates the production of the buffer layer and reduces the costs of production of the layer system. Moreover, ecological advantages are achieved.

What is claimed is:

1. A method for post-treating an absorber layer for photoelectric conversion of incident light into electric current, comprising:
    providing a chalcogen-containing absorber layer on a carrier;
    applying a post-treatment layer on a surface of the absorber layer;
    thermally diffusing the at least one post-treatment material into the absorber layer, during thermal diffusion, selectively increasing a surface termination of the absorber layer by controlling surface termination by chalcogen independently of passivation of the absorber layer by an alkali metal; and
    measuring an increased surface S-correlated Raman signal of the absorber layer after the post-treatment to confirm a level of the surface S-correlated Raman signal of the absorber layer,
    wherein the at least one post-treatment material has a dual function as 1) a supplier of the alkali metal for alkali passivation of the absorber layer and also as 2) a supplier of a sulfide for surface termination of the absorber layer with the increased surface S-correlated Raman signal after the post-treatment without or with additional surface cleaning, wherein the post-treatment layer contains exactly one post-treatment material selected from the group consisting of exactly one oxygen compound of an alkali chalcogenide and exactly one hydrogen-oxygen compound of an alkali chalcogenide, wherein only one single alkali element is chemically bound in the post-treatment material.

2. The method according to claim 1, wherein the thermally diffusing comprises heating the post-treatment layer.

3. The method according to claim 2, wherein the heating occurs in a temperature range from 70° C. to 700° C. with a heating time in a range from 1 min to 120 min.

4. The method according to claim 3, wherein the temperature range is from 150° C. to 700° C.

5. The method according to claim 2, wherein the heating occurs with an energy input in a range from 0.5 $J/cm^2$ to 15 $J/cm^2$.

6. The method of claim 5, wherein the energy input is made of pulses with a pulse duration in a range from 0.2 msec to 20 msec.

7. The method according to claim 1, wherein the absorber layer has, after the thermally diffusing, a metal content in a range from 0.02 atomic % to 2.5 atomic %, based on a total amount of material of the absorber layer.

8. The method according to claim 7, wherein the range is from 0.1 atomic % to 1.3 atomic %.

9. The method according to claim 1, wherein the thermally diffusing the at least one post-treatment material into the absorber layer is performed in an atmosphere containing at least one chalcogen or in a chalcogen-free atmosphere.

10. The method according to claim 9, wherein the chalcogen-free atmosphere consists of inert gas.

11. The method according to claim 1, wherein the post-treatment material is selected from the group consisting of a hydrogen-oxygen compound of a metal chalcogenide with an oxidation state IV selected from $NaHSO_3$, $KHSO_3$, $RbHSO_3$, and $CsHSO_3$, an oxygen compound of a metal chalcogenide with the oxidation state IV selected from $Na_2SO_3$, $K_2SO_3$, $Rb_2SO_3$, and $Cs_2SO_3$, a hydrogen-oxygen compound of a metal chalcogenide with an oxidation state VI selected from $NaHSO_3$, $KHSO_3$, $RbHSO_3$, and $CsHSO_3$, and an oxygen compound of a metal chalcogenide with the oxidation state VI selected from $Na_2SO_4$, $K_2SO_4$, $Rb_2SO_4$, $Cs_2SO_4$; and the chalcogen-containing absorber layer is CIGSSe.

12. The method according to claim 1, wherein the at least one post-treatment material is applied on the surface of the absorber layer by a process selected from thermal evaporation, wet-chemical bath deposition, electron beam evaporation, sputtering, atomic layer deposition, and spray pyrolysis.

13. The method according to claim 1, wherein the absorber layer has a temperature in a range from 300° C. to 800° C. during application of the post-treatment layer.

14. The method according to claim 1, wherein the thermally diffusing the at least one post-treatment material into the absorber layer is performed in a vacuumed environment.

15. The method according to claim 1, further comprising removing the at least one post-treatment material from the surface of the absorber layer after the thermally diffusing.

16. A thin-film solar cell production method comprising producing a layer system for thin-film solar cells, wherein the producing comprises the method of claim 1.

17. A method for producing a layer system for production of thin-film solar cells, comprising:
providing a carrier,
producing a back electrode layer on the carrier,
producing a chalcogen-containing absorber layer on the back electrode layer, the chalcogen-containing absorber layer being treated according to the method of claim 1, a surface termination of the absorber layer being selectively increased by controlling surface termination by chalcogen independently of passivation of the absorber layer by an alkali metal,
depositing at least one layer on the chalcogen-containing absorber layer,
producing a front electrode layer on the at least one buffer layer, and
measuring an increased surface S-correlated Raman signal of the absorber layer after the post-treatment to confirm a level of the surface S-correlated Raman signal of the absorber layer.

18. The method according to claim 17, wherein the at least one buffer layer is deposited in a vacuumed environment.

19. The method according to claim 18, wherein the at least one buffer layer is deposited by sputtering.

20. The method according to claim 17, wherein the at least one buffer layer comprises at least one of zinc oxysulfide, Zn(O,S) or zinc magnesium oxide, Zn1-xMgxO.

* * * * *